United States Patent [19]

Chang

[11] Patent Number: 5,612,240
[45] Date of Patent: Mar. 18, 1997

[54] METHOD FOR MAKING ELECTRICAL CONNECTIONS TO SELF-ALIGNED CONTACTS THAT EXTENDS BEYOND THE PHOTO-LITHOGRAPHIC RESOLUTION LIMIT

[75] Inventor: Ming-Bing Chang, Santa Clara, Calif.

[73] Assignee: Taiwan Semiconductor Manufacturing Company Ltd., Hsinchu, Taiwan

[21] Appl. No.: 663,439

[22] Filed: Jun. 13, 1996

[51] Int. Cl.⁶ .............................................. H01L 21/8234
[52] U.S. Cl. ........................... 437/44; 437/195; 437/200
[58] Field of Search ............................ 437/44, 56, 195, 437/200

[56] References Cited

U.S. PATENT DOCUMENTS

| | | | |
|---|---|---|---|
| 4,868,138 | 9/1989 | Chan et al. | 437/44 |
| 5,376,578 | 12/1994 | Hsu et al. | 437/56 |
| 5,439,848 | 8/1995 | Hsu et al. | 437/195 |
| 5,476,803 | 12/1995 | Liu | 437/44 |

*Primary Examiner*—John Niebling
*Assistant Examiner*—Michael S. Lebentritt
*Attorney, Agent, or Firm*—George O. Saile

[57] ABSTRACT

A method was achieved for making electrical connections to FET self-aligned source/drain areas extending the limits of the photolithographic resolution and relaxing the alignment tolerance. FET gate electrodes are formed by patterning a first polysilicon layer having a first insulating layer thereon. Lightly doped drains (LDDs) and insulating first sidewall spacers are then formed. A polycide layer (second polysilicon/silicide layer) having a second insulating thereon is then deposited and patterned. The new method involves etching the second insulating layer and partially into the polycide layer. After removing the photoresist, another dielectric layer is conformally deposited and then anisotropically etched back to form the second sidewall spacers. The remaining polycide layer is then etched using the second insulating layer and the second spacer as a hard mask. Thus, second poly extensions are formed over and onto the first poly and the field oxide. Using this new process, both the second polysilicon layer and the contact layer become alignment insensitive and silicon trenches, caused by misalignment, cannot occur. Furthermore, a minimum gate length, a minimum gate to FOX spacing and a minimum FOX isolation width can be achieved with the existing 0.35 um process technology.

12 Claims, 4 Drawing Sheets

METHOD FOR MAKING ELECTRICAL CONNECTIONS TO SELF-ALIGNED CONTACTS THAT EXTENDS BEYOND THE PHOTO-LITHOGRAPHIC RESOLUTION LIMIT

BACKGROUND-OF THE INVENTION (1) Field of the Invention

The present invention relates to the fabrication of integrated circuit devices on semiconductor substrates, and more particularly relates to a method for making closely spaced electrical connections to the self-aligned source/drain contacts on field effect transistors, where the spacings between electrical connections extend beyond the photo-lithographic resolution limit.

(2) Description of the Prior Art

In the past few years, advances in the high resolution photolithography and directional plasma etching in semiconductor process technologies have dramatically decreased the device feature size and increased the circuit density resulting in high device performance on integrated circuit chips. The device most used for Ultra Large Scale Integration (ULSI) is the Field Effect Transistor (FET), typically using a silicon gate electrode and having self-aligned source/drain contact areas. The popular choice of FETs is because of their very small size, high packing density, low power consumption, high yields, and low cost.

The conventional FETs are typically fabricated by patterning polysilicon gate electrodes over a thin gate oxide on a single crystal semiconductor substrate. The gate electrode structure on sub-micrometer channel length FETs is itself used as an implant barrier mask to form self-aligned lightly doped source/drain areas, often referred to as the LDD areas, in the substrate adjacent to the sides of the gate electrode. Sidewall insulating spacers formed next serve to mask the LDD areas, and the source/drain contact areas are then formed by ion implantation. The spacings between the source junction and drain junction adjacent to, and on each side of the gate electrode are therefore quite close.

The advances in high resolution photolithographic techniques and directional (anisotropic) plasma etching have reduced the minimum feature sizes, such as the width of the FET gate electrode (not to be confused with the FET channel width) over and along the FET channel length to well below a micrometer (um). For example, FETs are currently used in the industry having channel lengths that are less than a half micrometer (0.5 um) in length, and are expected to be about 0.25 um by the year 1998. If further increases in circuit density and device performance are to continue, then device minimum feature sizes, and more specifically the FET channel length, must be reduced to sub-half-micrometer dimensions (that is, to less than 0.5 um). This requires improved photoresist and exposure tools that improve the photolithographic resolution or, alternatively, process methods that extend the resolution of the current photoresist systems.

Because of this downscaling and the further reduction in the FET channel length, it becomes increasingly difficult to form the electrical connections to the self-aligned source/drain areas on each side of the FET gate electrode. These electrical contacts are usually formed by patterning a conductively doped polysilicon layer or polycide (polysilicon/silicide) layer that extend over the source/drain contacts, but are electrically separated from each other. Unfortunately, because of the photolithographic resolution and limitations in aligning the photoresist mask for patterning the polysilicon layer, misalignment can result in silicon trenches being etched in the substrate adjacent to the gate electrodes. These unwanted trenches degrade or destroy the field effect transistor devices. This misalignment can also result in these unwanted trenches being formed in the silicon substrate adjacent to the narrow field oxide regions that separate the individual device areas of the FETs.

Therefore, there is still a strong need in the semiconductor industry for making electrical connections to the self-aligned source/drain contacts on FETs, while avoiding the occurrence of misaligned photoresist masking, for etching the polysilicon layer that make the electrical contacts to the FET source/drain areas.

SUMMARY OF THE INVENTION

It is therefore a principal object of this invention to extend the resolution limits of the current photolithography by a novel structure and processing method to achieve closer spacing between electrical connections for closely spaced contacts.

It is a further object of this invention to provide this improved method and structure for reducing the spacing between the electrical connections for self-aligned source/drain contacts on field effect transistors (FETs) having sub-half-micrometer gate electrodes.

Another object of this invention is to provide a process which utilizes the current photoresist technology thereby minimizing manufacturing cost.

In summary, this invention provides a method for fabricating improved electrical connections to self-aligned source/drain contact areas for field effect transistors (FETs). The electrical contacts are formed having reduced spacings that extend beyond the limit of the photolithographic resolution. This increases the latitude allowed in the misalignment of the photoresist image, which otherwise can result in trenches being etched in the silicon substrate, at the edge of the FET gate electrode and at the edge of the field oxide, that would degrade device characteristics.

The fabrication process starts by providing a semiconductor substrate, typically composed of single crystal silicon that is conductively doped with a P- or N-type dopant. A relatively thick field oxide (FOX) is formed on the surface, surrounding and electrically isolating device areas on and in which the field effect transistors (FETs) are built. A thin gate oxide is grown on the substrate surface in the active device areas. Next, a relatively thick first polysilicon layer is deposited over the gate oxide and the field oxide regions and is conductively doped. For example, the conductive dopant would be an N-type dopant such as arsenic (As) for N-channel FETs. A first insulating layer, such as silicon oxide ($SiO_2$), is deposited by low pressure chemical vapor deposition (LPCVD) over the first polysilicon layer. The first polysilicon layer and the first insulating layer are then patterned to form the gate electrodes for the FETs in the device areas, and electrical interconnecting lines on the field oxide regions. Lightly doped source/drain areas are then formed adjacent to the gate electrodes in the device areas by ion implantation. A conformal first sidewall insulating layer is then deposited and anisotropically plasma etched back to form the first sidewall spacers on the gate electrodes. A conformal second polysilicon layer is deposited over the substrate making electrical contact to the device areas. Self-aligned source/drain contact areas are then formed by diffusing $N^+$ and $P^+$ dopant atoms from the second polysilicon layer which is implanted with $N^+$ and $P^+$ ions for the NMOSFET and PMOSFET, respectively. A refractory metal silicide layer, such as tungsten silicide ($WSi_2$) is deposited on the second polysilicon layer to form a polycide layer, and a second insulating layer, for example, silicon oxide, is deposited using LPCVD and a reactant gas such as tetraethosiloxane (TEOS). The second polysilicon/silicide layer with the second insulating layer thereon is now patterned, by the method of this invention, which provides the electrical connections having reduced spacings that exceed the resolution of the photolithographic process. Continuing with the method, a photoresist layer is deposited and patterned to leave portions extending over the source/drain contact areas to form electrical connections, and elsewhere on the field oxide regions to form the electrical interconnections. The photoresist is patterned, removing portions over the gate electrodes forming openings that lie between source/drain areas in each of the FETs. The openings between the source/drain contacts have the minimum feature size achievable by the photoresist layer. Using the method of this invention, anisotropic plasma etching is used to remove the second insulating layer and to partially etch into the polycide layer, thereby forming recesses having vertical sidewalls in the silicon oxide/polycide layer. After removing the photoresist layer, such as by plasma ashing, a conformal second sidewall insulating layer, preferably a silicon nitride ($Si_3N_4$) layer, is deposited and is anisotropically etched back to form second sidewall spacers on the sidewalls in the recesses. This provides an opening having a minimum feature size that is less than the minimum feature size achieved by the photoresist alone, and thus a 0.35 micrometer (um) gate length and a self-aligned contact process can be achieved with the existing photolithography technology. The anisotropic plasma etching is then used to remove the remaining polycide layer and the second polysilicon layer in the recesses between the second sidewall spacers down to the first insulating layer on the gate electrode. These reduced spacings are also concurrently formed over the field oxide regions. The improved electrical connections having these reduced spacings allow additional latitude in the photoresist alignment tolerances, thereby avoiding the formation of silicon trenches in the source/drain areas that would degrade the device electrical characteristics. The same reduction in spacing over the field oxide regions prevents etching into the source/drain contacts at the field oxide edge, and thus isolation spacings between device areas can be minimized.

BRIEF DESCRIPTION OF THE DRAWINGS

The objects and other advantages of this invention are best understood by the preferred embodiment with reference to the attached drawings which are now briefly described.

DESCRIPTION OF THE PREFERRED EMBODIMENTS

In keeping with the objects of this invention, a more detailed description is given for the method of making the electrical connections to the source/drain areas of the FETs. The method provides a means for extending the limits of the photolithography resolution, and thereby reduces the spacings between the electrical connections. This allows one to relax the alignment ground rule tolerances during the exposure of the photoresist layer, while still improving on the packing density of the devices on an integrated circuit chip. This increases the latitude allowed in the alignment of the photoresist image, which otherwise, if misaligned, can result in unwanted trenches being etched in the silicon substrate at the edge of the FET gate electrode and at the edge of the field oxide, that would degrade device characteristics.

Although the method is described for N-channel FETs formed on a $P^-$ doped silicon substrate, it should be well understood by one skilled in the art that by including additional processing steps, other types of devices can also be formed on the semiconductor chip. For example, P-channel FETs can be formed by providing N-Wells in the P substrate and CMOS circuits can be formed therefrom. It should also be understood that the figures show only two FETs of the multitude of FET devices that are fabricated simultaneously on the substrate.

Figure 1:
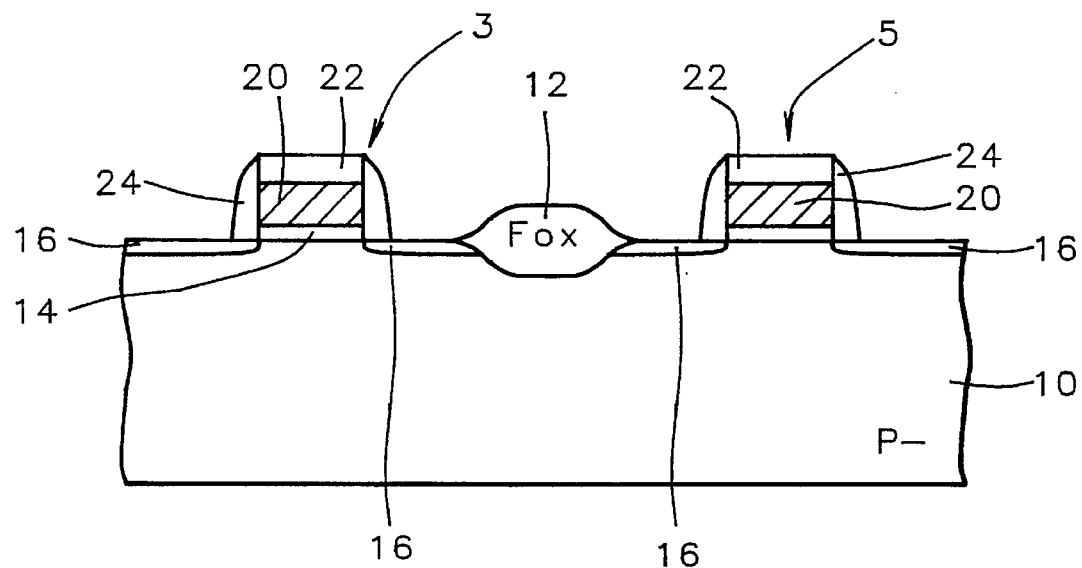
FIGS. 1 through 5 show a series of schematic cross-sectional views of a portion of a substrate for forming the electrical connections to the self-aligned source/drain areas of a field effect transistor (FET) by the method of this invention.

Referring now to FIG. 1, a portion of the semiconductor substrate 10 is shown having two partially completed field effect transistors formed in and on the substrate surface. Preferably the substrate 10 is composed of a P-type single crystal having, for example, a <100> crystallographic orientation. A relatively thick field oxide 12 is then formed around the active device areas. However, only a portion of field oxide 12 is shown in FIG. 1, separating two device areas. The most common method in the semiconductor industry for forming the field oxide 12 is by the LOCal Oxidation of Silicon (LOCOS). Although the method of forming the field oxide by LOCOS is not shown in FIG. 1, the LOCOS oxide is formed by depositing and patterning a silicon nitride ($Si_3N_4$) layer, leaving portions over the device areas as a barrier mask to oxidation. The substrate 10 is then subjected to a thermal oxidation. For example, the thermal oxidation can be carried out in an oxidation furnace using steam oxidation to form the field oxide 12. Typically the field oxide 12 is between about 3000 and 4000 Angstroms thick for the 0.35 um technology. After removing the silicon nitride layer, the FETs are formed next in the device areas.

The FET devices are now formed by growing a thin thermal oxide on the active device areas to form the gate oxide 14 to a preferred thickness from about 70 to 80 Angstroms for the 0.35 um technology. Next, a first polysilicon layer 20 which is heavily doped is deposited over the gate oxide 14 and the field oxide 12 regions, and is typically deposited to a thickness of between about 2500 and 3500 Angstroms. Alternatively, layer 20 can also be a polycide layer. Layer 20 is preferably in situ doped by an N-type dopant such as phosphorus for N-channel FETs. A first insulating layer 22 is deposited on the first polysilicon layer 20. Preferably layer 22 is a silicon oxide ($SiO_2$) deposited, for example, by low pressure chemical vapor deposition (LPCVD) using tetraethosiloxane (TEOS) as a reactant gas. The preferred thickness of layer 22 is between about 1500 and 2000 Angstroms.

Using conventional photolithographic techniques and anisotropic plasma etching, the first polysilicon layer 20 and the first insulating layer 22 are patterned to form the FET gate electrodes (indicated by 3 and 5 in FIG. 1) over the device areas.

Lightly doped source/drains 16 for the N-channel FETs are formed next, usually by implanting an N-type atomic species, such as arsenic or phosphorus. For example, a typical implant might consist of $p^{31}$ having a dose of between 1.0 E 13 and 1.0 E 14 atoms/cm$^2$ and an implant energy between about 30 and 80 keV. After forming the lightly doped source/drain areas 16, a conformal first sidewall insulating layer 24 is deposited and anisotropically etched back to form the first sidewall spacers 24 on the sidewalls of the gate electrodes 3 and 5. Layer 24 is deposited by LPCVD using, for example, TEOS and is preferably deposited to a thickness of between about 1000 and 1500 Angstroms, and more specifically, having a thickness of 1000 Angstroms.

Figure 2:
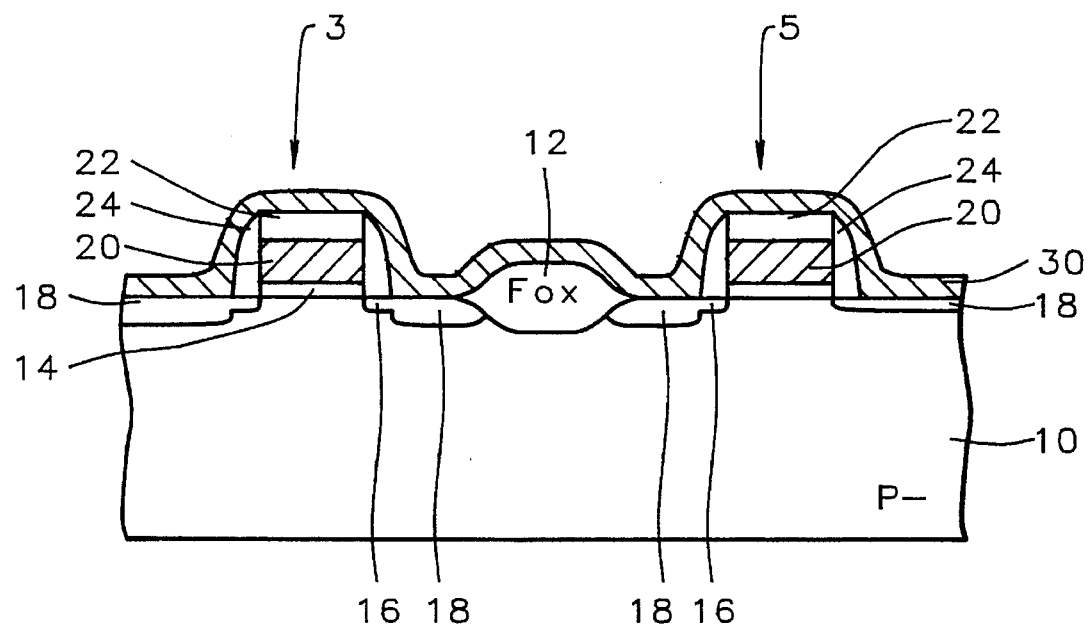

Referring now to FIG. 2, a conformal second polysilicon layer 30 is deposited over the gate electrodes 3 and 5 and also over the exposed silicon substrate surface in the device areas. Preferably layer 30 is deposited in an LPCVD reactor using, for example, silane (SiH$_4$) as the reactant gas. Layer 30 is preferably deposited to a thickness of between about 1500 and 2000 Angstroms.

After depositing layer 30, the self-aligned source/drain contact areas 18 are formed next by implanting dopant ions into the second polysilicon layer 30, and later diffusing these dopant atoms into the device areas adjacent to the first sidewall spacers 24 during the thermal treatment in the following steps. Typically, the source/drain contact areas 18 are formed by ion implantation using dopant sources such as arsenic (As$^{75}$) for the NMOSFET and boron for the PMOSFET. For example, the implantation can be carried out using an implant dose of between about 5.0 E 15 and 1.0 E 16 atoms/cm$^2$.

Figure 3:
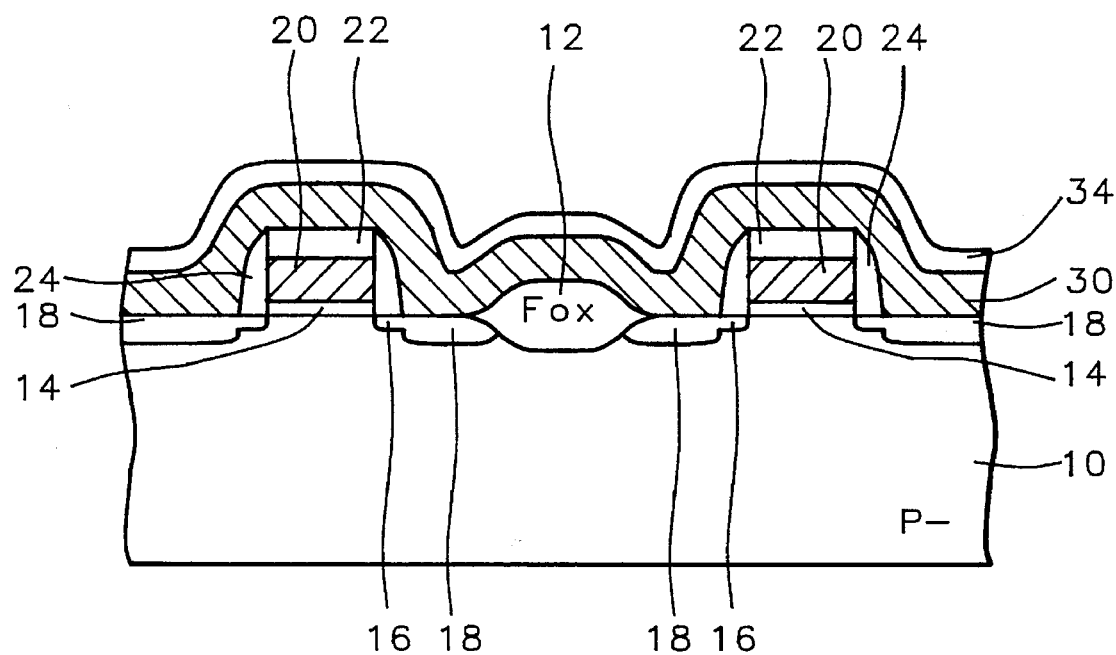

Referring now to FIG. 3 and continuing with the process, a conformal refractory metal silicide layer is deposited on the second polysilicon layer 30 to form a polycide layer, also referred to as layer 30. Preferably the refractory metal silicide is composed of a tungsten silicide (WSi$_2$). The tungsten silicide is preferably deposited by LPCVD using, for example, tungsten hexafluoride (WF$_6$) as the reactant gas. The WSi$_2$ is deposited to a thickness of between about 1000 and 1500 Angstroms.

Still referring to FIG. 3, a second insulating layer 34 is deposited on the polycide layer 30. Layer 34 is preferably composed of silicon oxide (SiO$_2$) and is deposited using LPCVD using a reactant gas such as TEOS. The silicon oxide layer 34 is preferably deposited to a thickness of between about 2000 and 3000 Angstroms.

Figure 4:
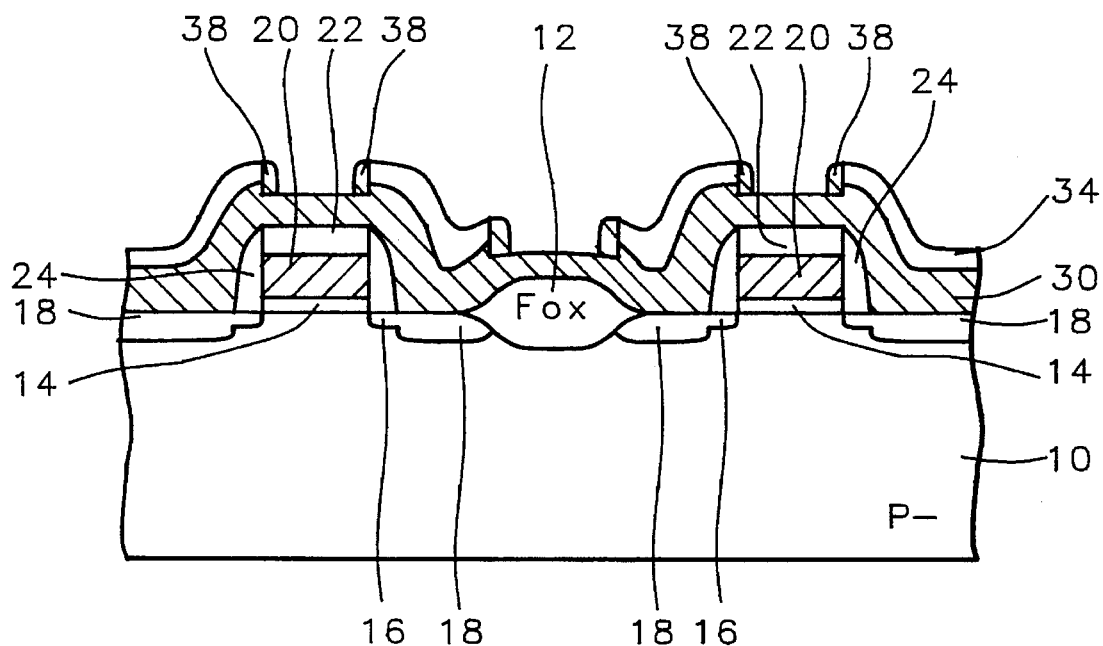
Figure 5:
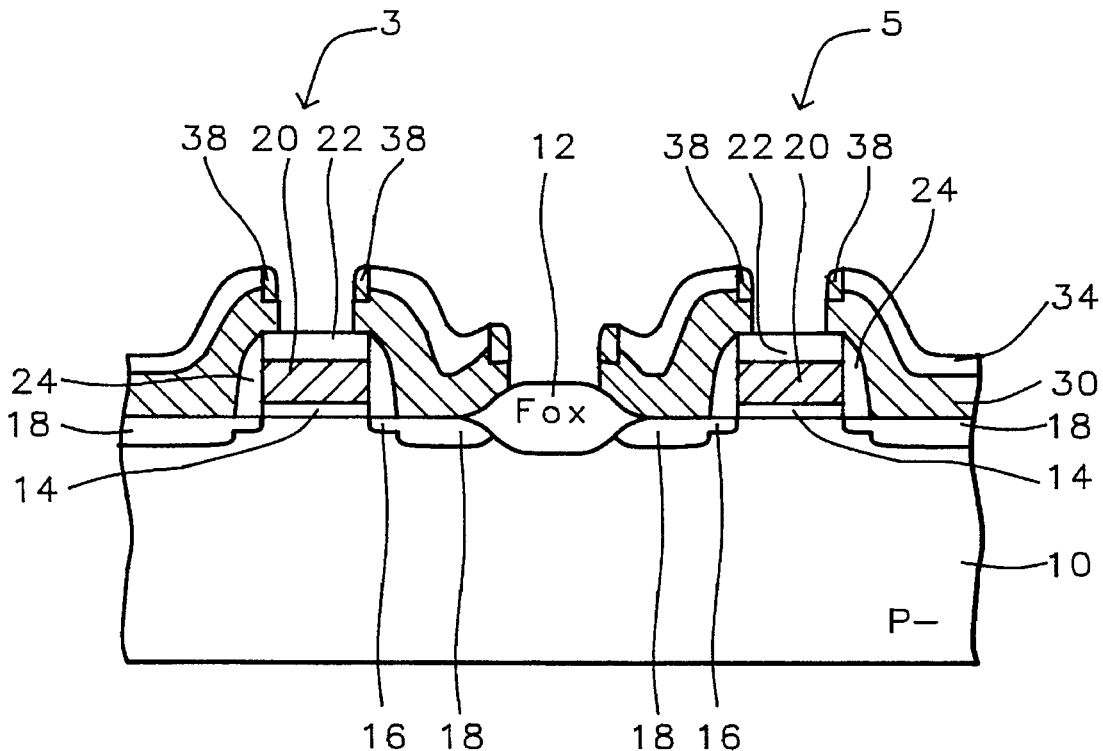

Now referring more specifically to the method of this invention, the multilayer formed from the second polysilicon layer 30 having a silicide layer on the surface, and the insulating layer 34 is patterned using current photolithographic techniques to etch the insulating layer and to etch partially into the polycide layer 30. After stripping the photoresist, another insulating layer, preferably silicon nitride (Si$_3$N$_4$), is conformally deposited and anisotropically etched back to form the second spacers 38 (see FIG. 4). The silicon nitride is deposited to a preferred thickness of between about 1000 and 1500 Angstroms. Using the insulating layer 34 and the second spacer 38 as a hard mask, the remaining polycide layer 30 in the recesses is etched and source/drain self-aligned contacts are formed, as shown in FIG. 5.

Figure 6:
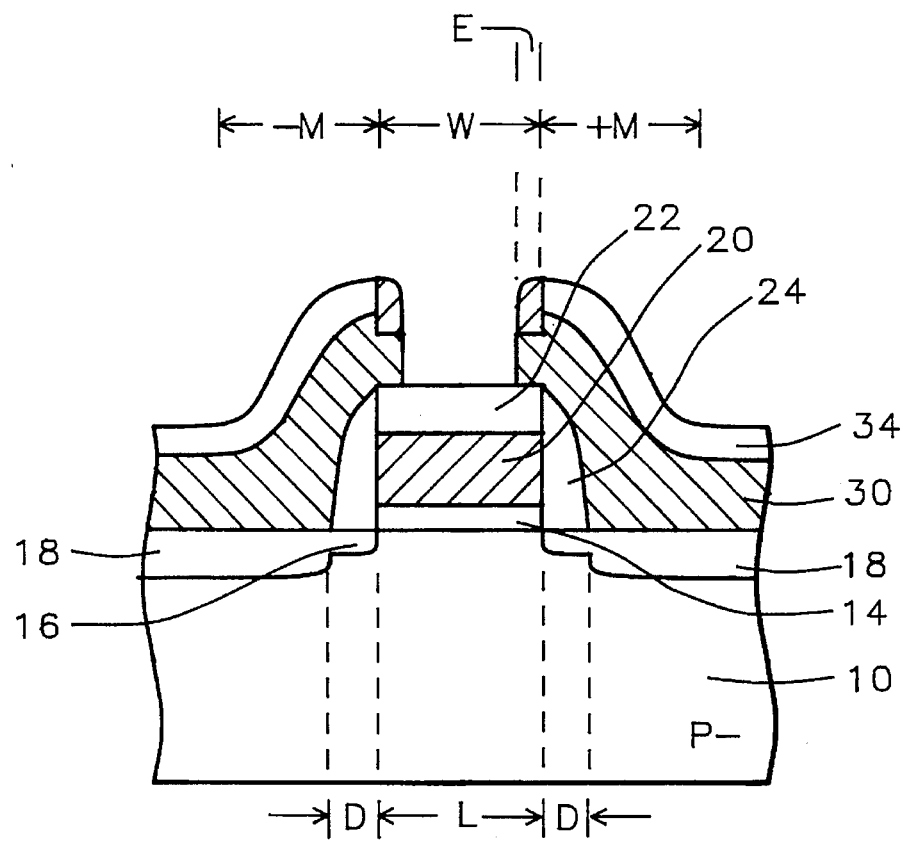
FIG. 6 is an enlarged cross-sectional view of one of the field effect transistors shown in FIG. 5, depicting in more detail the completed electrical connections to the FET source/drain contact areas, having reduced spacings between the electrical connections by the method of this invention.
Figure 7:
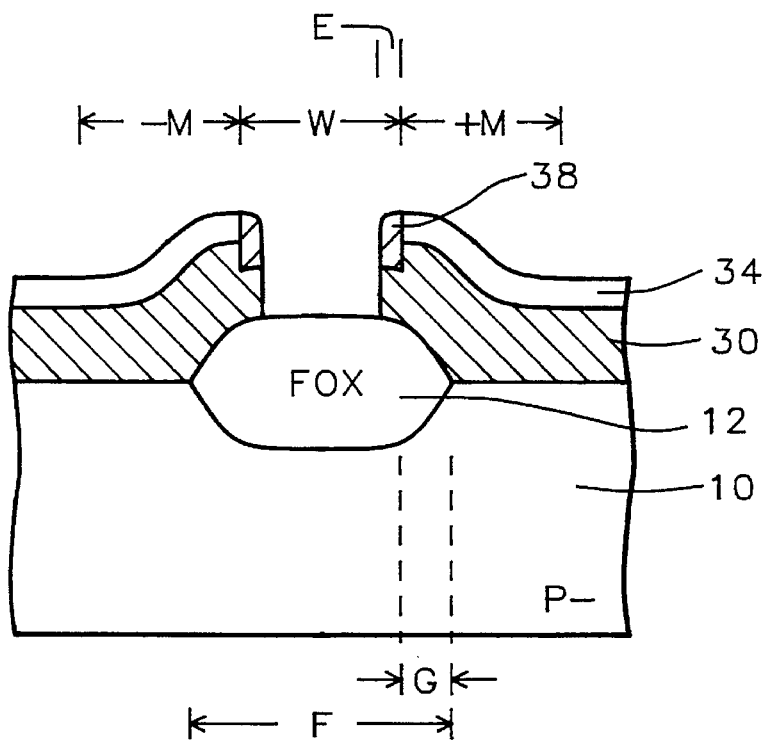
FIG. 7 is an enlarged cross-sectional view showing the formation of the electrical connections having reduced spacings over the field oxide regions in FIG. 5.

To better understand the advantages of this invention, an enlarged cross-sectional view of the electrical connections to source/drains contact areas 18 of an FET gate electrode region (e.g., gate electrodes 3 or 5 in FIG. 5) is shown in FIG. 6. An enlarged cross-sectional view of the electrical connections extending over the narrow field oxide region 12 is shown in FIG. 7. Using the state-of-art 0.35 um technology, the minimum poly opening (W in FIGS. 6 and 7) is 0.35 um and the manufacturing alignment tolerance is +/–0.15 um (depicted in FIGS. 6 and 7 by +/–M). With a 0.35 um poly gate length (L in FIG. 6) and a 0.1 um spacer width D, silicon trenches can occur at the gate edge in the presence of a 0.15 um misalignment. Although spacer width can be increased to 0.15 um to marginally solve this issue, the transistor performance is compromised due to a higher series resistance in the LDD regions. Without using the self-aligned contact process, the poly to FOX spacing (G in FIG. 7) has to be increased to accommodate a metal contact and thus packing density and parasitic junction capacitance are suffered. By using the process of this invention, a second spacer width of 0.1 um (E in FIGS. 6 and 7) can completely eliminate the silicon trench issue. By doing so, the second poly and the contact layers are alignment insensitive. Furthermore, a minimum gate length of 0.35 um and a minimum gate to field oxide spacing of 0.45 um can be achieved with the current 0.35 um process technology.

The same argument as above for extending the photolithography limit using sidewall spacers 38 also applies to forming the electrical connections extending over the field oxide region 12, as shown in FIG. 7. Using the state-of-art 0.35 um technology, the minimum field oxide width F is 0.65 um in order to keep the silicon at the field oxide edge from being trenched. However, using the process presented in this invention, the minimum field oxide width can be as narrow as 0.5 um which is limited by the LOCOS isolation scheme using the current 0.35 um technology. Therefore, using the process presented in this invention, a self-aligned contact can be achieved while maintaining the minimum LOCOS isolation layout rules.

While the invention has been particularly shown and described with reference to the preferred embodiments thereof, it will be understood by those skilled in the art that various changes in form and details may be made without departing from the spirit and scope of the invention. For example, by reversing the polarity of the first and second conductive type dopants and appropriately selecting the dopant concentrations, it is possible to fabricate a P$^-$ channel FET by the same invention.

What is claimed is:

1. A method for fabricating electrical connections to self-aligned source/drain contact areas for field effect transistors comprising the steps of:

forming on a semiconductor substrate field oxide regions surrounding and electrically isolating device areas;

forming a gate oxide on said device areas;

depositing a first polysilicon layer on said device areas and elsewhere on said substrate, said first polysilicon layer being conductively doped;

depositing a first insulating layer on said first polysilicon layer;

patterning by using a photoresist mask and anisotropic plasma etching said first insulating layer and said first polysilicon layer, thereby forming gate electrodes over said device areas and electrical interconnecting lines over said field oxide regions;

forming lightly doped source/drain areas in said device areas adjacent to said gate electrodes by ion implantation;

depositing a first sidewall insulating layer; and anisotropically plasma etching said first sidewall insulating layer thereby forming insulating sidewall spacers on sidewalls of said gate electrodes;

depositing a conformal second polysilicon layer on said substrate and contacting said device areas;

forming self-aligned source/drain contact areas in said device areas adjacent to said sidewall spacers by ion implanting into said second polysilicon layer;

forming a refractory metal silicide layer on said second polysilicon layer, thereby forming a polycide layer;

depositing a second insulating layer on said silicide layer;

coating a photoresist layer on said second insulating layer;

patterning said photoresist layer, said patterned photoresist layer having open regions over said gate electrodes and lying between said source/drain areas in each said field effect transistor, and also having open regions over said field oxide regions, said open regions having the minimum feature size achievable by said photoresist layer;

anisotropically plasma etching and removing said second insulating layer, and etching partially into said polycide layer in said open regions and thereby forming recesses having vertical sidewalls;

removing said photoresist layer;

depositing a second sidewall insulating layer and anisotropically etching back thereby forming second sidewall spacers on said sidewalls in said recesses thereby reducing said minimum feature size of said photoresist by twice the width of said second sidewall spacers;

anisotropic plasma etching and removing said remaining polycide layer in said recesses between said second sidewall spacers, and thereby completing said electrical connections to said self-aligned source/drain contact areas.

2. The method of claim 1, wherein said first polysilicon layer is between about 2500 and 3000 Angstroms thick.

3. The method of claim 1, wherein said first insulating layer is composed of silicon oxide ($SiO_2$) and is between about 1500 and 2000 Angstroms thick.

4. The method of claim 1, wherein said second polysilicon layer is between about 1500 and 2000 Angstroms thick.

5. The method of claim 1, wherein said refractory metal silicide layer is between 1000 and 1500 Angstroms thick.

6. The method of claim 1, where said refractory metal layer is tungsten silicide ($WSi_2$).

7. The method of claim 1, wherein said second insulating layer is composed of silicon oxide ($SiO_2$) having a thickness of between about 2000 and 3000 Angstroms thick.

8. The method of claim 1, wherein said openings in said photoresist layer have said minimum feature size of 0.35 um for the 0.35 um technology.

9. The method of claim 1, wherein said second sidewall insulating layer is composed of silicon nitride ($Si_3N_4$).

10. The method of claim 1, wherein said second sidewall insulating layer is composed of silicon oxide ($SiO_2$).

11. The method of claim 1, wherein said second sidewall insulating layer is deposited to a thickness of between about 1000 and 1500 Angstroms.

12. The method of claim 1, wherein said second sidewall spacers after said anisotropic etch back are between about 0.075 and 0.1 micrometers (um) wide.

* * * * *